(12) United States Patent
Ahn et al.

(10) Patent No.: US 11,877,491 B2
(45) Date of Patent: Jan. 16, 2024

(54) DISPLAY PANEL

(71) Applicant: Samsung Display Co., Ltd., Yongin-si (KR)

(72) Inventors: Jeaheon Ahn, Hwaseong-si (KR);
Seok-Joon Hong, Seongnam-si (KR);
YeoGeon Yoon, Suwon-si (KR);
Myoungjong Lee, Cheonan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 17/509,120

(22) Filed: Oct. 25, 2021

(65) Prior Publication Data
US 2022/0045134 A1    Feb. 10, 2022

Related U.S. Application Data

(63) Continuation of application No. 16/706,908, filed on Dec. 9, 2019, now Pat. No. 11,158,682.

(30) Foreign Application Priority Data

Jan. 9, 2019   (KR) .......................... 10-2019-0002732

(51) Int. Cl.
*H10K 59/38* (2023.01)
*H10K 50/842* (2023.01)
*H10K 59/126* (2023.01)

(52) U.S. Cl.
CPC ......... *H10K 59/38* (2023.02); *H10K 50/8426* (2023.02); *H10K 59/126* (2023.02)

(58) Field of Classification Search
CPC .. H10K 59/38; H10K 50/8426; H10K 59/126; H10K 2102/331; H10K 50/865;
(Continued)

(56) References Cited

U.S. PATENT DOCUMENTS 6,305,806 B1   10/2001   Hirakata ................. H04N 5/21
                                                348/E5.077
6,597,421 B1    7/2003   Hatanaka .......... G02F 1/133553
                                                349/110
(Continued)

FOREIGN PATENT DOCUMENTS

KR    1020100004224 A    1/2010
KR    1020160066635 A    6/2016
(Continued)

*Primary Examiner* — Kyoung Lee
*Assistant Examiner* — Christina A Sylvia
(74) *Attorney, Agent, or Firm* — CANTOR COLBURN LLP

(57) ABSTRACT

A display panel includes an upper substrate to which external light is incident, a sealing member which is in a non-display area and couples the upper substrate to a lower display substrate. The upper display substrate includes: a base substrate; a light shielding layer and filter layer each corresponding to the non-display area and absorbing a portion of external light which is transmitted through the base substrate at the non-display area, the filter layer and the light shielding layer having different colors from each other. In a first non-display area of the base substrate which corresponds to the sealing member, only one among the filter layer and the light shielding layer is disposed. In a second non-display area of the base substrate which is adjacent to the first non-display area, both the filter layer and the light shielding layer are disposed.

20 Claims, 12 Drawing Sheets

(58) Field of Classification Search
CPC ............. H10K 59/35; G02F 1/133514; G02F 1/133512; G02F 1/1336; G02F 1/133614
See application file for complete search history.

(56) References Cited

U.S. PATENT DOCUMENTS

| | | | |
|---|---|---|---|
| 7,499,130 B2 | 3/2009 | Tsai | G02F 1/133512 349/110 |
| 9,287,342 B2 | 3/2016 | Kwon | H01L 27/124 |
| 9,608,046 B2 | 3/2017 | Lee et al. | |
| 10,903,446 B2 | 1/2021 | Son | H01L 51/524 |
| 2012/0099061 A1* | 4/2012 | Lee | H01J 11/44 349/110 |
| 2012/0188151 A1* | 7/2012 | Oh | G02F 1/1337 345/87 |
| 2015/0179586 A1 | 6/2015 | Youk | G02F 1/133512 428/195.1 |
| 2017/0023829 A1* | 1/2017 | Im | G02F 1/133617 |
| 2017/0062529 A1* | 3/2017 | Paek | H10K 59/38 |
| 2017/0308211 A1* | 10/2017 | Adachi | G02F 1/134309 |
| 2017/0331065 A1 | 11/2017 | Seo | H01L 27/323 |
| 2017/0343859 A1* | 11/2017 | Chen | G02B 5/201 |
| 2020/0119237 A1 | 4/2020 | Kim et al. | |

FOREIGN PATENT DOCUMENTS

| | | |
|---|---|---|
| KR | 1020160082760 A | 7/2016 |
| KR | 10-2020-0042058 A | 4/2020 |

\* cited by examiner

DISPLAY PANEL

This application is a continuation application of U.S. application Ser. No. 16/706,908 filed Dec. 9, 2015, which claims priority to Korean Patent Application No. 10-2019-0002732, filed on Jan. 9, 2019, and all the benefits accruing therefrom under 35 U.S.C. § 119, the entire contents of which are hereby incorporated by reference.

BACKGROUND

(1) Field

The present disclosure herein relates to a display panel, and more particularly, to a display panel having improved visibility of an image displayed thereby.

(2) Description of the Related Art

Various display devices that are used for multimedia devices such as a television, a mobile phone, a tablet computer, a navigation unit, and a game console have been developed. Among display devices, a photo-luminescent liquid crystal display ("LCD") having an improved light utilization efficiency and an enhanced color balance has been developed. Various display devices may be used in an outside environment where there is external light.

SUMMARY

The present disclosure provides a display panel capable of relieving external light reflection.

An embodiment of the invention provides a display panel including: an upper display substrate defining a display area and a non-display area which is adjacent to the display area; a lower display substrate facing the upper display substrate; and a sealing member which couples the upper display substrate to the lower display substrate, the sealing member disposed in the non-display area. The upper display substrate includes: a base substrate; a light shielding layer including a first portion which corresponds to the display area and a second portion which corresponds to the non-display area; and a filter layer which is in the non-display area, the filter layer having a color different from a color of the second portion of the light shielding layer and overlapping the sealing member.

In an embodiment, the filter layer surrounds the display area on the plane.

In an embodiment, in the non-display area, the second portion of the light shielding layer may overlap the sealing member.

In an embodiment, in the non-display area, the filter layer may be disposed on the base substrate while entirely overlapping the sealing member.

In an embodiment, the filter layer may cover at least one portion of the second portion of the light shielding layer.

In an embodiment, the filter layer may have one of blue and red colors, and the light shielding layer may have a black color.

In an embodiment, the display area may include first to third pixel areas and a light shielding area which is adjacent to the first to third pixel areas, and the lower display substrate may include a display element layer including first to third display elements each of which emits light having a first color while overlapping the first to third pixel areas, respectively.

In an embodiment, the first portion of the light shielding layer may correspond to the light shielding area.

In an embodiment, the upper display substrate may further include a color filter layer disposed on the base substrate, and the color filter layer may include: a first color filter through which light having a second color different from the first color is transmitted, the first color filter corresponding to the first pixel area; a second color filter through which light having a third color different from the first color and the second color is transmitted, the second color filter corresponding to the second pixel area; and a third color filter including a filter portion through which light having the first color is transmitted, the filter portion of the third color filter corresponding to the third pixel area.

In an embodiment, the upper display substrate may further include a light control layer which receives the light having the first color which is emitted from the first to third display elements and provides color-converted light to the color filter layer, the light control layer including: a first conversion member which corresponds to the first color filter, color-converts the light having the first color which is emitted from the display element layer into the light having the second color, and emits the light having the second color to the first color filter; a second conversion member which corresponds to the second color filter, color-converts the light having the first color into the light having the third color, and emits the light having the third color to the second color filter; and a transmission member which corresponds to the third color filter and transmits the light having the first color to the third color filter.

In an embodiment, the light shielding layer may be integrated with the third color filter.

In an embodiment, the filter layer may overlap an entirety of the non-display area.

In an embodiment, each of the light shielding layer and the third color filter may have a blue color, and the filter layer may have a red color.

In an embodiment, the filter layer may correspond to the first area of the base substrate and extend from the first area of the base substrate to overlap an entirety of the second portion of the light shielding layer which is in the non-display area, and a portion of the filter layer which corresponds to the sealing member may be directly on the base substrate.

In an embodiment of the invention, a display panel includes: an upper display substrate, the upper display substrate defining: a display area including a plurality of pixel areas and a light shielding area which is adjacent to each of the plurality of pixel areas, and a non-display area which is adjacent to the display area; a lower display substrate facing the upper display substrate; and a sealing member which couples the upper display substrate to the lower display substrate, the sealing member disposed in the non-display area. The upper display substrate includes: a base substrate; a color filter layer including a first light shielding portion which corresponds to the light shielding area in the display area and a second light shielding portion which corresponds to the non-display area, each of the first light shielding portion and the second light shielding portion having a first color; and a filter layer which is in the non-display area, the filter layer disposed non-overlapping the sealing member.

In an embodiment, the filter layer may surround the display area.

In an embodiment, the first color may be a blue color, and the filter layer may have a red color.

In an embodiment, the second light shielding portion may correspond to an entirety of the non-display area, and the sealing member may surround the filter layer.

In an embodiment, the color filter layer may include: a first color filterthrough which light having a second color different from the first color is transmitted, the first color filter corresponding to a first pixel area among the plurality of pixel areas; a second color filter through which light having a third color different from the first color and the second color is transmitted, the second color filter corresponding to a second pixel area adjacent to the first pixel area among the plurality of pixel areas; and a third color filter including a filter portion corresponding to a third pixel area adjacent to the second pixel area among the plurality of pixel areas and through which light having the first color is transmitted. The first light shielding portion and the second light shielding portion are in a same layer as the filter portion and transmit the light having the first color.

An embodiment of the invention provides a display panel including: an upper display substrate to which light from outside the display panel is incident, the upper display substrate defining a display area and a non-display area which is adjacent to the display area; a lower display substrate facing the upper display substrate; and a sealing member which couples the upper display substrate to the lower display substrate, the sealing member disposed in the non-display area. The upper display substrate includes: a base substrate through which the light from outside the display panel is transmitted; a light shielding layer including a first portion which corresponds to the display area and a second portion which corresponds to the non-display area and absorbs a portion of light which is transmitted through the base substrate at the non-display area; and a filter layer which is in the non-display area and absorbs a portion of the light which is transmitted through the base substrate at the non-display area, the filter layer having a color different from a color of the second portion of the light shielding layer. In the non-display area, the base substrate includes a first area which corresponds to the sealing member and a second area which is between the first area and the display area, in the first area of the base substrate, only one among the filter layer and the second portion of the light shielding layer is disposed, and in the second area of the base substrate: both the filter layer and the second portion of the light shielding layer are disposed, and the second portion of the light shielding layer is between the base substrate and the filter layer along a thickness direction of the display panel.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
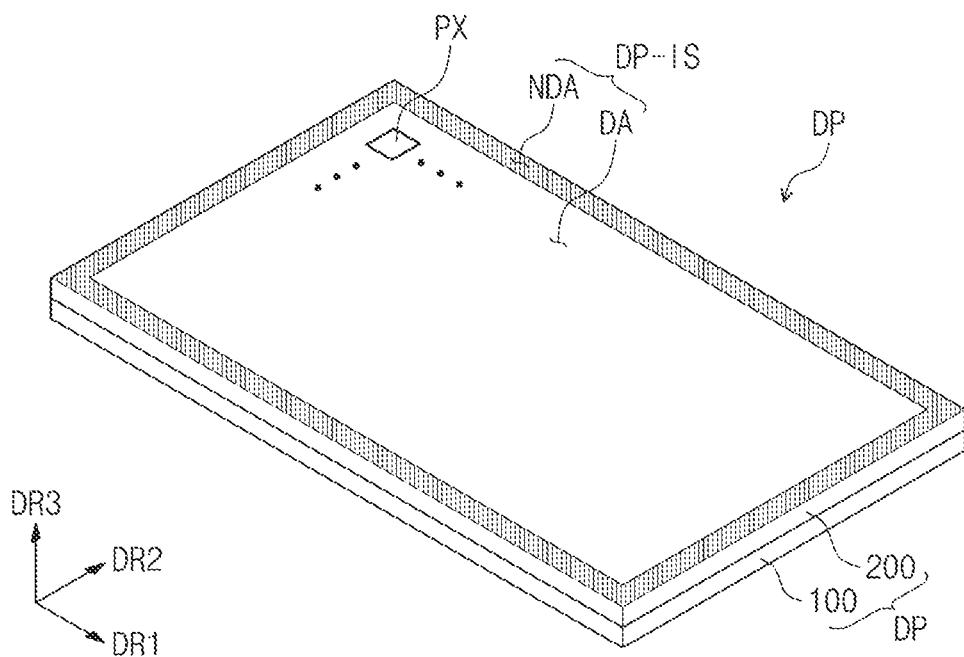
FIG. 1 is a perspective view illustrating an embodiment of a display panel.

In this specification, it will also be understood that when one component (or region, layer, portion) is referred to as being related to another element such as being "on," "connected to" or "coupled to" another component, it can be directly disposed relative to the one component, or an intervening third component may also be present. In contrast, when one component (or region, layer, portion) is referred to as being related to another element such as being "directly on," "directly connected to" or "directly coupled to" another component, no intervening third component is present.

Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or" includes any and all combinations of one or more of the associated listed items.

It will be understood that although the terms such as "first" and "second" are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under", "below", "above", "upper", and the like are used for explaining relation association of components illustrated in the drawings. The terms may be a relation and described based on directions expressed in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of "include" or "comprise" specifies a property, a fixed number, a step, an operation, an element, a component or a combination thereof, but does not exclude other properties, fixed numbers, steps, operations, elements, components or combinations thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When various display devices are used in an outside environment with sufficient external light, external light may be incident to a display surface of a display device, and then reflected and scattered at the display surface. For example, a color of some components within the display device may be visible through the display surface due to the reflected and scattered external light. The components within the display device that are visible through the display surface may undesirably degrade visibility of an image displayed by the display device.

Hereinafter, embodiments of the invention will be described with reference to the accompanying drawings.

Figure 2:
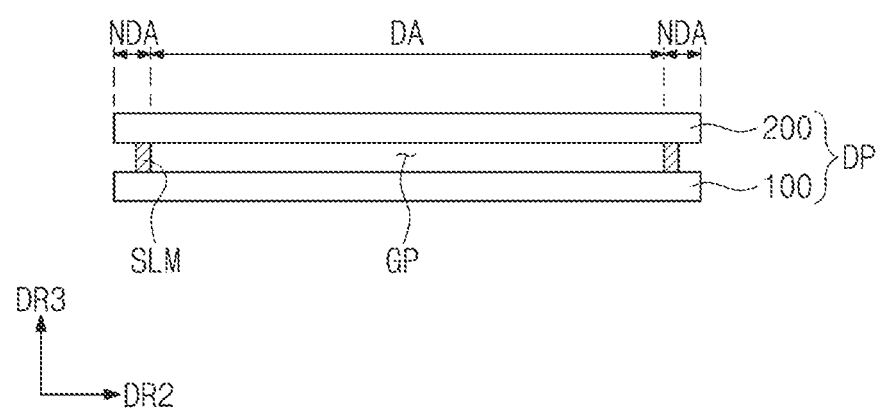
FIG. 2 is a cross-sectional view of an embodiment of a display panel of FIG. 1.

FIG. 1 is a perspective view illustrating an embodiment of a display panel. FIG. 2 is a cross-sectional view illustrating an embodiment of a display panel.

The display panel DP may be used for relatively large-sized electronic devices such as monitors or outdoor advertisement boards as well as relatively small and medium-sized electronic devices such as personal computers, notebook computers, personal digital terminals, navigation units for vehicles, game consoles, smartphones, tablet computers, and cameras. The above-described devices are exemplified as merely examples of display devices which generate and display an image, and thus, the display panel DP may be adopted for other electronic devices unless departing from the spirit and scope of the invention.

According to an embodiment of the invention, the display panel DP may be one of a liquid crystal display panel, an electrophoretic display panel, a microelectromechanical system ("MEMS") display panel, an electrowetting display panel, and an organic light emitting display panel. However, the embodiment of the invention is not limited thereto.

Although not separately shown, the display panel DP may further include a chassis member or a molding member. Also, when the display panel DP is a liquid crystal display panel, the display panel DP may be provided with light from a backlight unit which generates and provides the light to the display panel DP. One or more embodiment of the display panel DP may be used in a display device which displays an image. Hereinafter, in this specification, the display panel DP will be described as an organic light emitting display panel. With the organic light emitting display panel, a separate backlight unit may be omitted since light is generated within the organic light emitting display panel and emitted for displaying an image.

Referring to FIG. 1, the display panel DP may include a lower display substrate 100 and an upper display substrate 200 which is spaced apart from the lower display substrate 100 while facing the same. As illustrated in FIG. 1, the display panel DP may display an image through a display surface DP-IS. The display surface DP-IS is disposed in a plane which is parallel to a plane defined by a first direction DR1 and a second direction DR2 crossing each other. The upper display substrate 200 may define the display surface DP-IS, without being limited thereto.

The display surface DP-IS may include a display area DA and a non-display area NDA which is adjacent to the display area DA. A pixel PX is disposed in the display area DA, and the pixel PX is not disposed in the non-display area NDA. The non-display area NDA is defined along an edge of the display surface DP-IS. According to an embodiment of the invention, the display area DA may be surrounded by the non-display area NDA. However, the embodiment of the invention is not limited thereto. In another embodiment, for example, the non-display area NDA may be adjacent to less than all sides of the display area DA, such as being adjacent to only one side of the display area DA, or omitted completely. A sum of a planar area of the display area DA and a planar area of the non-display area NDA may define a total area of the display surface DP-IS, without being limited thereto.

A normal direction to the display surface DP-IS, e.g., a thickness direction of the display panel DP, is indicated by a third direction DR3. In this specification, an expression of "when viewed from a plane or on a plane" may represent a case of an element viewed along the third direction DR3. Hereinafter, a front surface (or top surface) and a rear surface (or bottom surface) of each of members or units are distinguished along the third direction DR3. However, directions indicated by the first to third directions DR1, DR2, and DR3 may be a relation, and converted with respect to each other, e.g., converted into an opposite direction.

According to an embodiment of the invention, although the display panel DP having a flat-type display surface DP-IS is illustrated, the invention is not limited thereto. In an embodiment, for example, the display panel DP may include a display surface DP-IS in which at least a portion has a curved shape or a three-dimensional shape. The three-dimensional display surface may include the display area DA provided in plural and disposed in different planes or directions from each other.

Referring to FIG. 2, a cell gap GP corresponding to an inner space between the upper display substrate 200 and the lower display substrate 100 may be defined therebetween. At the cell gap GP, elements and components of the upper display substrate 200 and the lower display substrate 100 may be excluded. The cell gap GP may be maintained by an adhesive layer SLM that couples the upper display substrate 200 and the lower display substrate 100 to each other. In an embodiment, for example, the adhesive layer SLM may include an organic adhesive member or an inorganic adhesive member. As used throughout all portions of this disclosure, the adhesive layer SLM may be otherwise referred to as a sealing member.

Figure 3:
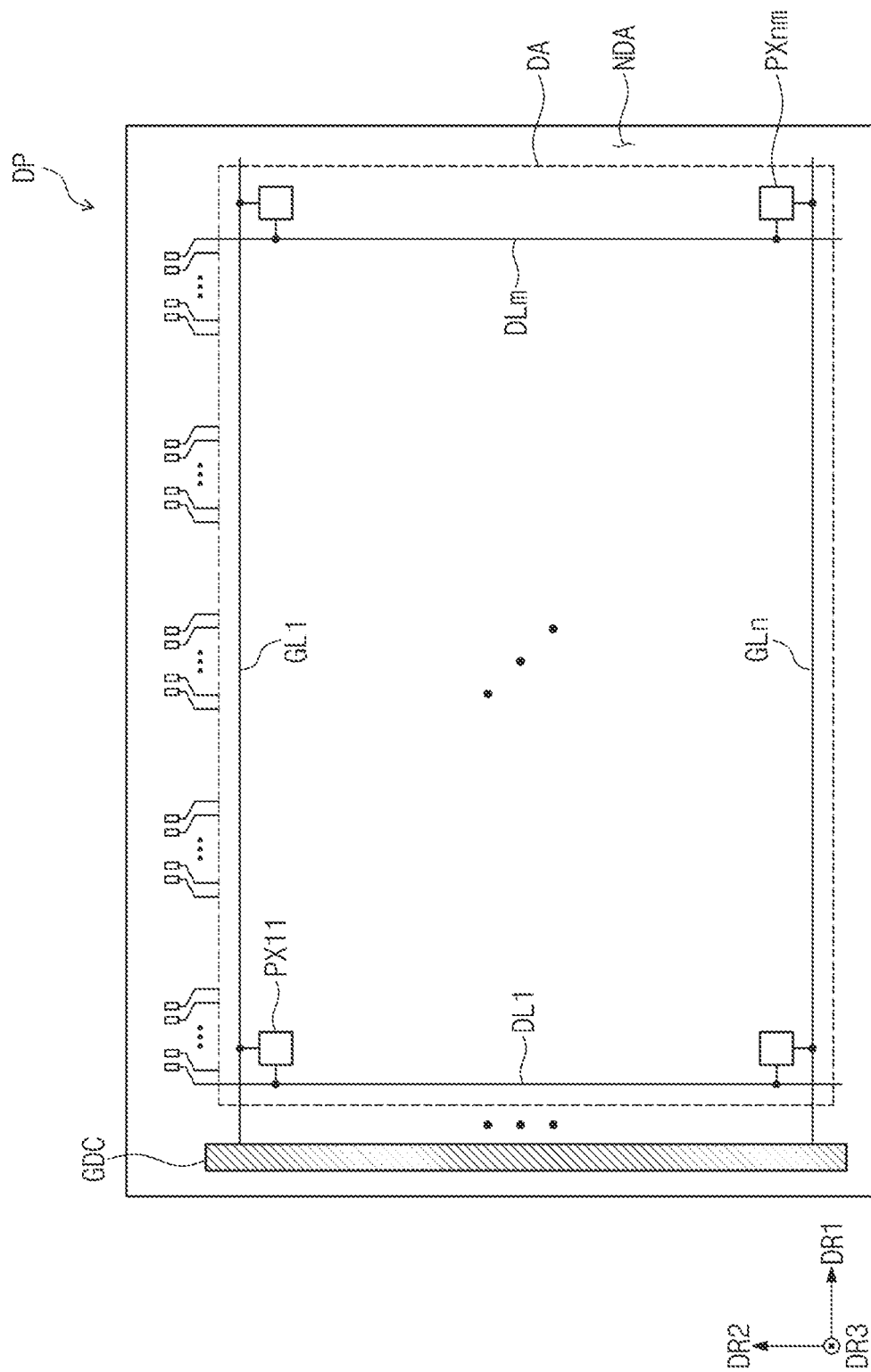
FIG. 3 is a top plan view of an embodiment of a display panel.

FIG. 3 is a top plan view illustrating an embodiment of a display panel.

Referring to FIG. 3, a planar arrangement relationship between signal lines GL1 to GLn and DL1 to DLm and pixels PX11 to PXnm is illustrated. The signal lines GL1 to GLn and DL1 to DLm may include a plurality of gate lines GL1 to GLn and a plurality of data lines DL1 to DLm.

Each of the pixels PX11 to PXnm is connected to a corresponding gate line of the plurality of gate lines GL1 to GLn and a corresponding data line of the plurality of data lines DL1 to DLm. Each of the pixels PX11 to PXnm may include a pixel driving circuit and a display element which is connected to the pixel driving circuit and driven or controlled thereby to generate light, emit light and/or display an image. Additional signal lines may be provided in the display panel DP according to a configuration of the pixel driving circuit. Various control signals, driving signals, power signals, data signals, etc. are transmitted through respective signal lines to drive and/or control the pixels PX11 to PXnm and elements thereof to generate light, emit light and/or display an image.

Although the pixels PX11 to PXnm may be arranged in a matrix form along a plane such as that defined by the first direction DR1 and the second direction DR2 in FIG. 3, the invention is not limited thereto. In an embodiment, for example, the pixels PX11 to PXnm may be arranged in a PenTile matrix form. Alternatively, the pixels PX11 to PXnm may be arranged in a diamond form.

A gate driving circuit GDC may be disposed in the non-display area NDA. The gate driving circuit GDC may be integrated to the display panel DP through an oxide silicon gate driver circuit ("OSG") or amorphous silicon gate driver circuit ("ASG") process.

Figure 4A:
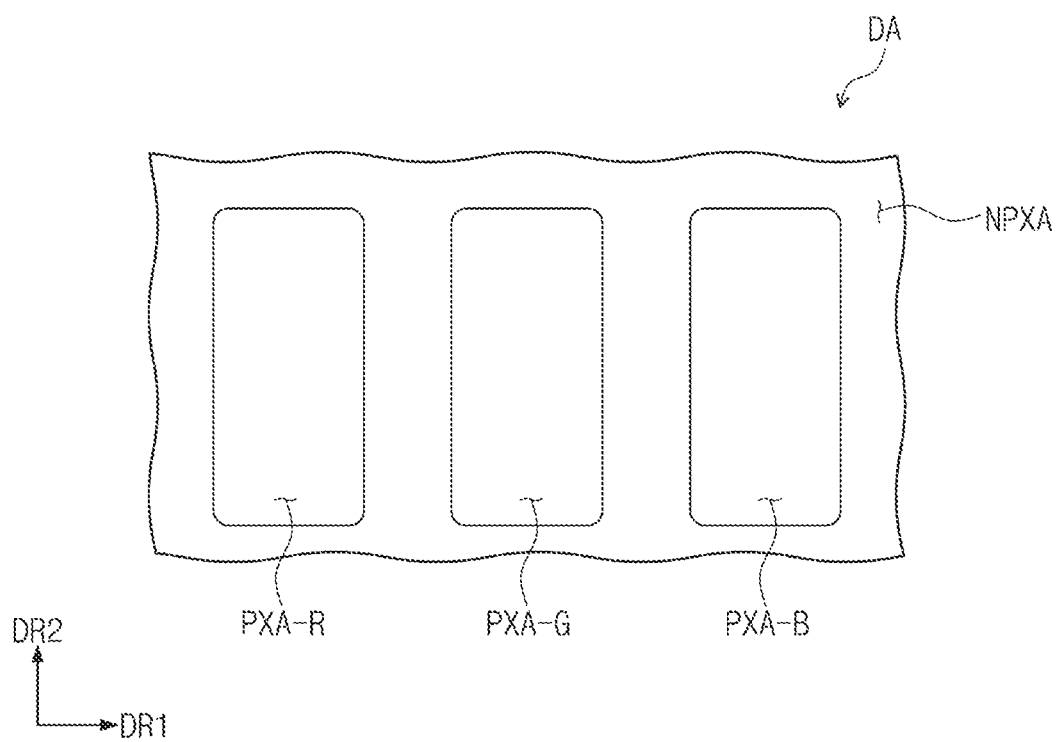
FIG. 4A is an enlarged top plan view illustrating an embodiment of pixel areas in a display area of a display panel.
Figure 4B:
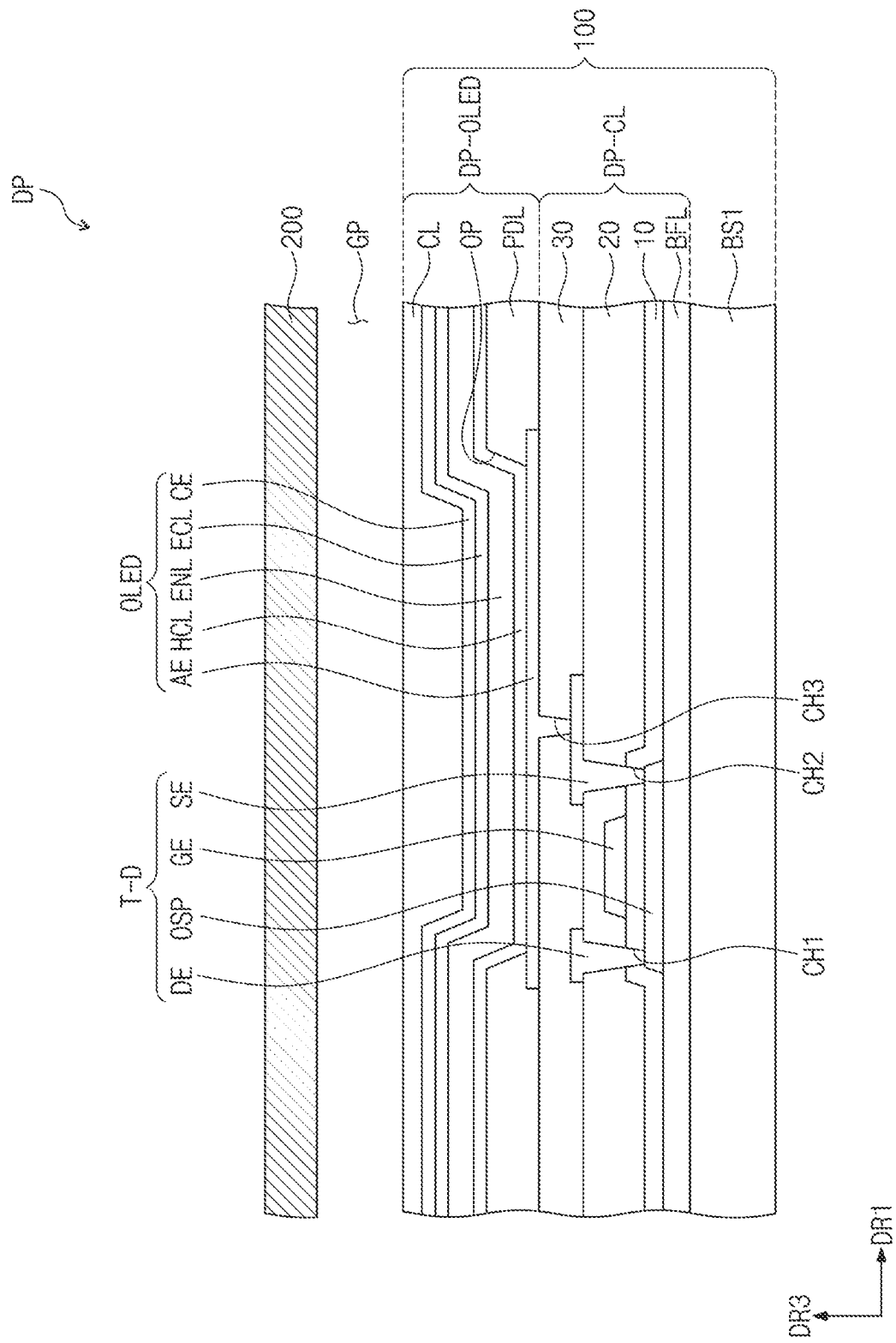
FIG. 4B is enlarged cross-sectional view illustrating an embodiment of a portion of a pixel area of a display panel.

FIG. 4A is a top plan view illustrating pixel areas of the display area of the display panel according to an embodiment of the invention. FIG. 4B is a cross-sectional view illustrating a portion of the pixel area of the display panel according to an embodiment of the invention.

FIG. 4A is an enlarged top plan view illustrating an embodiment of a portion of the display area DA in FIG. 1. The display area DA may include a pixel area PXA provided in plurality (e.g., a plurality of pixel areas PXA) and a light shielding area NPXA which is disposed adjacent thereto and therebetween. For convenience of description, a first pixel area PXA-R, a second pixel area PXA-G and a third pixel area PXA-B are mainly illustrated in FIG. 4A. As used throughout all portions of this disclosure, the first pixel area PXA-R, the second pixel area PXA-G and the third pixel area PXA-B may be otherwise referred to as pixel areas PXA-R, PXA-G, and PXA-B or the first to third pixel areas PXA-R, PXA-G, and PXA-B. The pixel areas PXA-R, PXA-G, and PXA-B illustrated in FIG. 4A may be repeatedly arranged over an entirety of the display area DA.

The light shielding area NPXA is disposed adjacent to and around the first to third pixel areas PXA-R, PXA-G, and PXA-B. The first to third pixel areas PXA-R, PXA-G, and PXA-B and the light shielding area NPXA may be substantially defined with respect to planar areas of the upper display substrate 200. In this specification, a pixel area may represent an area of the upper display substrate 200 at which external light is substantially emitted through the display surface DP-IS in FIG. 1.

Although the first to third pixel areas PXA-R, PXA-G, and PXA-B exemplarily have the same planar area as each other in FIG. 4A, the embodiment of the invention is not limited thereto. The first to third pixel areas PXA-R, PXA-G, and PXA-B and the light shielding area NPXA may have different planar areas from each other, or at least two thereof may have different planar areas from each other.

Although each of the first to third pixel areas PXA-R, PXA-G, and PXA-B has a rectangular planar shape having a round corner in the top plan view, the embodiment of the invention is not limited thereto. In an embodiment, for example, each of the first to third pixel areas PXA-R, PXA-G, and PXA-B may have another polygonal planar shape or a regular polygonal shape having a round corner.

One of the first to third pixel areas PXA-R, PXA-G, and PXA-B provides first color light within a first color wavelength band, another thereof provides second color light within a second color wavelength band and which is different from the first color, and the remaining one thereof provides third color light within a third color wavelength band and which is different from the first color and the second color.

According to an embodiment of the invention, the first pixel area PXA-R may provide red light, the second pixel area PXA-R may provide green light, and the third pixel area PXA-B may provide blue light. According to an embodiment of the invention, source light to each of the first to third pixel areas PXA-R, PXA-G, and PXA-B may be blue light that is the first color light. The source light may be generated from a light source which is separate from the display panel DP, such as a backlight unit, or a display element such as a light emitting diode which is within the display panel DP.

The light shielding area NPXA may define a boundary between the first to third pixel areas PXA-R, PXA-G, and PXA-B to reducing or effectively prevent mixing of color light between the first to third pixel areas PXA-R, PXA-G, and PXA-B. Also, the light shielding area NPXA blocks the source light to reduce or effectively prevent the source light from being emitted to outside the display panel DP at areas thereof which source light should not be visible to outside the display panel DP.

FIG. 4B exemplarily illustrates an enlarged cross-section of the display panel DP, which corresponds to the second pixel area PXA-G. The enlarged cross-section of FIG. 4B illustrates a driving transistor T-D and a light emitting element OLED which is connected to the driving transistor T-D and controlled and/or driven thereby to generate and/or emit light. Here, the upper display substrate 200 is simply illustrated in FIG. 4B, without defining elements or components thereof in detail.

Referring to FIG. 4B, the lower display substrate 100 includes a first base substrate BS1, a circuit element layer DP-CL disposed on the first base substrate BS1, and a display element layer DP-OLED disposed on the circuit element layer DP-CL.

The first base substrate BS1 may include a synthetic resin substrate or a glass substrate. The circuit element layer DP-CL includes at least one insulation layer and a circuit element. The circuit element includes a signal line and a driving circuit of a pixel. In an embodiment of a method of providing a display panel DP, the circuit element layer DP-CL may be provided or formed through a process of providing or forming an insulation layer, a semiconductor layer, and a conductive layer such as by coating, deposition, or the like, and a process of patterning the insulation layer, the semiconductor layer, and the conductive layer such as by a photolithography process.

The circuit element layer DP-CL may include a buffer layer BFL, a first insulation layer 10, a second insulation layer 20, and a third insulation layer 30. In an embodiment, for example, each of the first insulation layer 10 and the second insulation layer 20 may be an inorganic layer, and the third insulation layer 30 may be an organic layer. However, the invention is not limited thereto. In another embodiment, for example, each of the first insulation layer 10 and the second insulation layer 20 may be a layer in which the inorganic layer and the organic layer are combined.

In FIG. 4B, an arrangement relationship between a semiconductor pattern OSP, a control electrode GE, an input electrode DE, and an output electrode SE of the driving transistor T-D is exemplarily illustrated. First to third through-holes CH1, CH2, and CH3 are also exemplarily illustrated.

The display element layer DP-OLED includes the light emitting element OLED as a display element. The light emitting element OLED may generate the above-described source light. The light emitting element OLED includes a first electrode AE, a second electrode CE, and a light emitting layer ENL disposed therebetween. In the embodiment, the light emitting element OLED may include an organic light emitting diode.

The display element layer DP-OLED includes a pixel defining layer PDL. In an embodiment, for example, the pixel defining layer PDL may be an organic layer.

The first electrode AE is disposed on the third insulation layer 30. The first electrode AE is connected to the output electrode SE at or through a third contact hole CH3 passing through a thickness of the third insulation layer 30. A light emitting opening OP is defined in and by the pixel defining layer PDL. The display area DA may include the light emitting opening OP provided in plurality. The light emitting opening OP of the pixel defining layer PDL exposes at least a portion of the first electrode AE. According to an embodiment of the invention, the light emitting opening OP may be defined as a light emitting area at which light from the light emitting element OLED is emitted outside the light emitting element OLED. That is, the light emitting area may be provided in plurality corresponding to the light emitting opening OP provided in plurality within the display area DA, and the plurality of light emitting areas may correspond to the pixel areas, respectively.

A hole control layer HCL, the light emitting layer ENL, and an electron control layer ECL may be common disposed on each of the first electrode AE and the pixel defining layer PDL. The hole control layer HCL, the light emitting layer ENL, and the electron control layer ECL may be disposed in common to correspond to each of the first to third pixel areas PXA-R, PXA-G, and PXA-B (refer to FIG. 4A).

The hole control layer HCL may include a hole transporting layer, and may further include a hole injection layer. The light emitting layer ENL may generate blue light. The blue light may have a wavelength of about 410 nanometers (nm) to about 480 nm. The blue light may have a maximum peak in a light emitting spectrum of about 440 nm to about 460 nm. The electron control layer ECL may include an electron transporting layer and an electron injection layer. The light emitting layer ENL may have a tandem structure or a single layer structure.

The second electrode CE is disposed on the electron control layer ECL. The second electrode CE may be disposed in common corresponding to each of the first to third pixel areas PXA-R, PXA-G, and PXA-B. The second electrode CE has a planar area greater than that of the first electrode AE. That is, the electrode CE may extend further than edges of the first electrode AE define the planar area greater than that of the first electrode AE. A cover layer CL, which protects the second electrode CE, may be further disposed on the second electrode CE. The cover layer CL may include an organic material or an inorganic material. In an embodiment, the cover layer CL may be omitted.

Although not separately shown, the lower display substrate 100 may include the light emitting element OLED provided in plurality such as to define first to third light emitting elements respectively corresponding to the first to third pixel areas PXA-R, PXA-G, and PXA-B in FIG. 4A. The first to third light emitting elements may have the same laminated structure as each other, and have the laminated structure of the light emitting element OLED in FIG. 3B.

Figure 5:
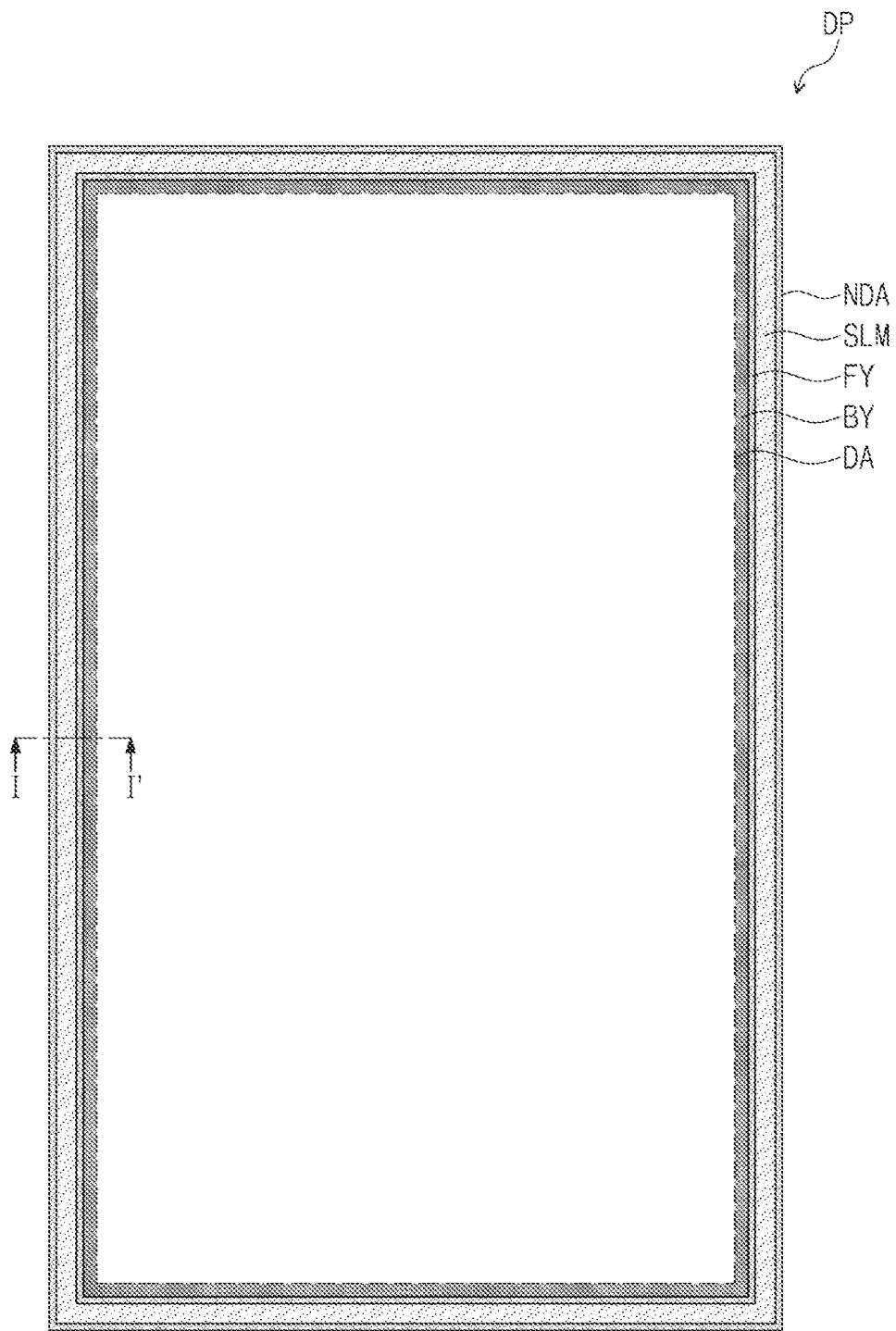
FIG. 5 is a top plan view illustrating an embodiment of a display panel.
Figure 6:
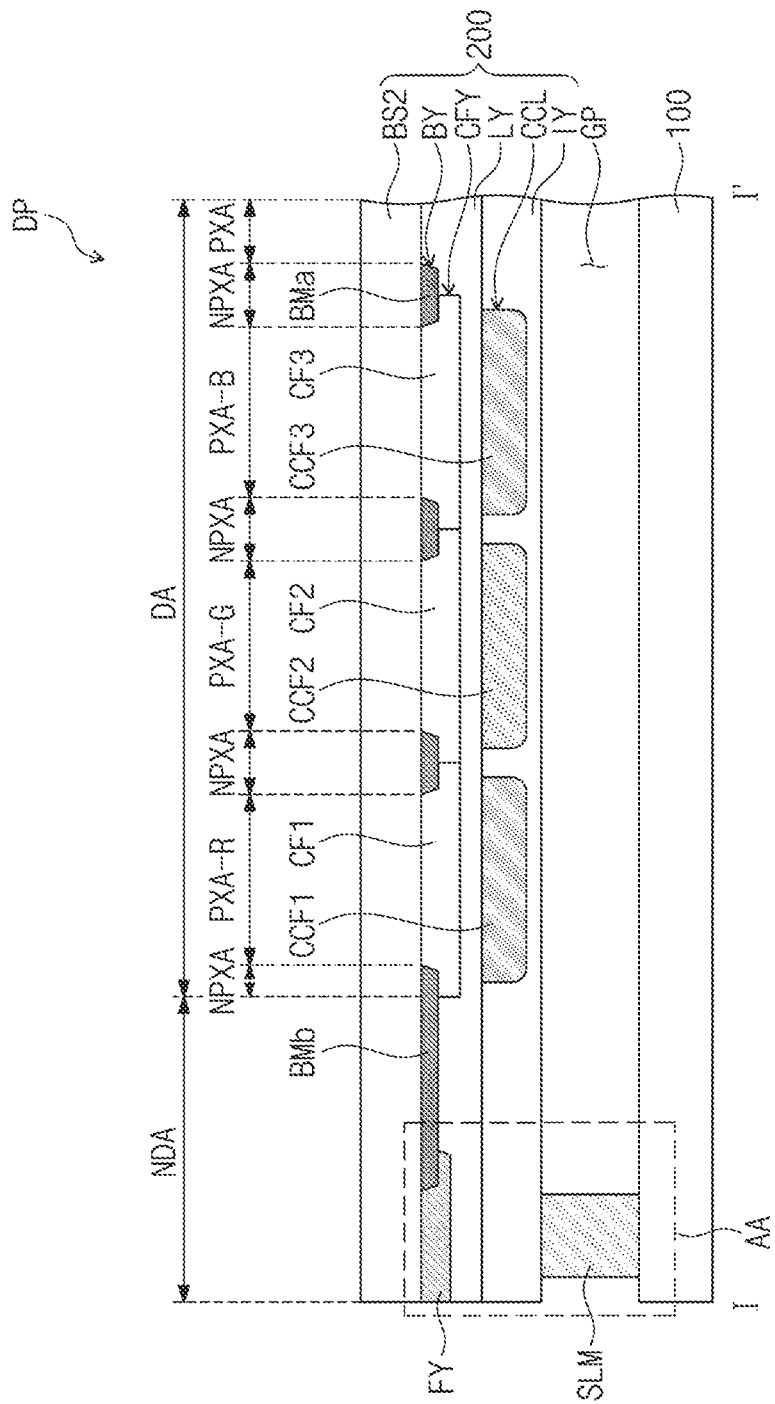
FIG. 6 is an enlarged cross-sectional view taken along line I-I' of FIG. 5.
Figure 7A:
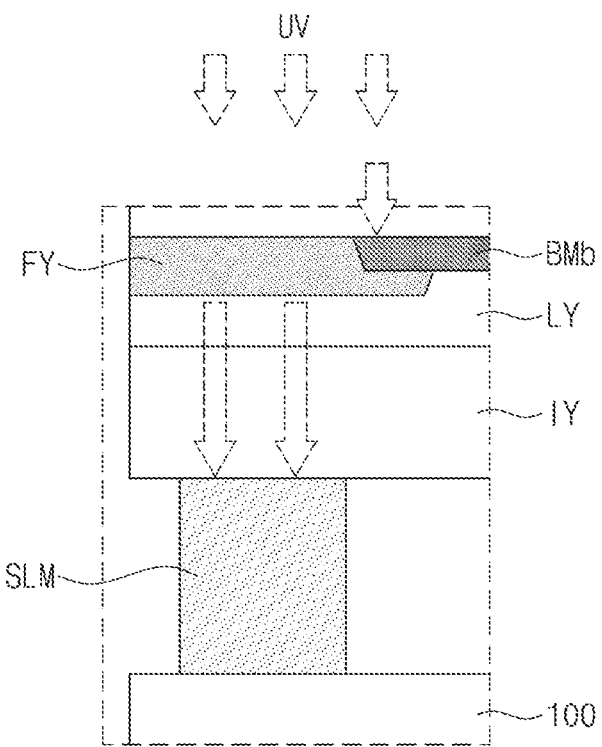
FIG. 7A is an enlarged cross-sectional view illustrating region AA in FIG. 6.
Figure 7B:
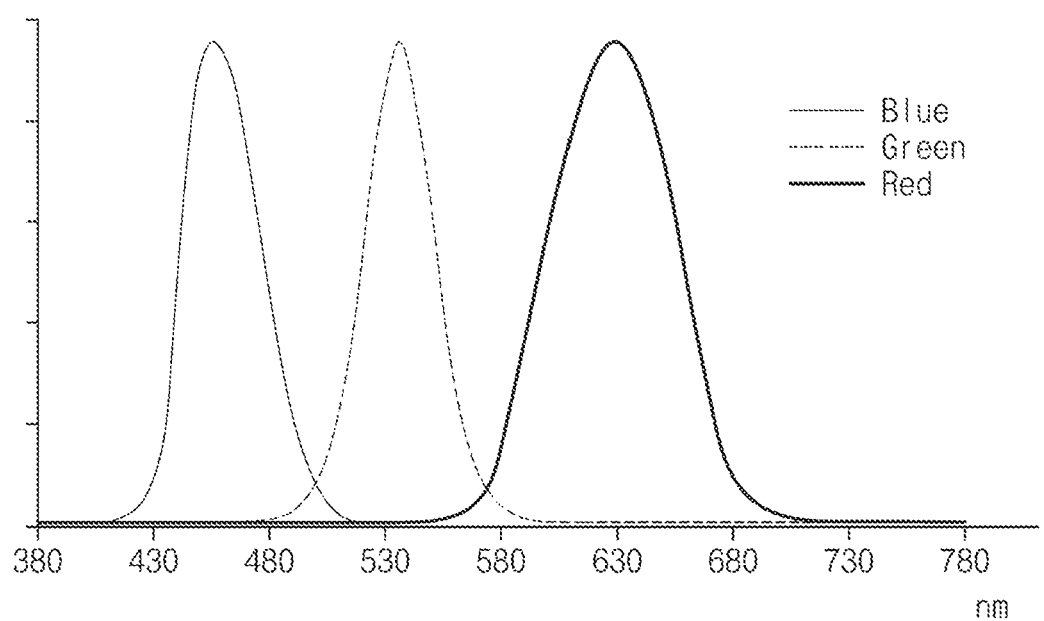
FIG. 7B is a graph showing relative intensities versus wavelength ranges of color lights.
Figure 8:
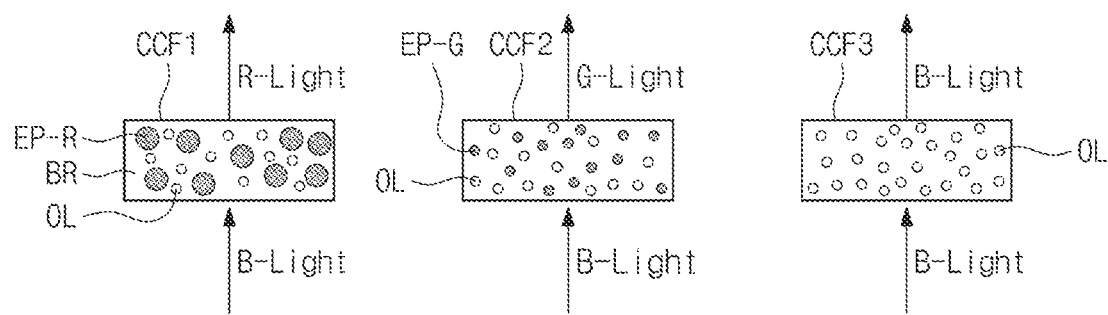
FIG. 8 is an enlarged schematic view illustrating optical characteristics of an embodiment of a light control layer in FIG. 6.

FIG. 5 is a top plan view illustrating an embodiment of a display panel. FIG. 6 is an enlarged cross-sectional view taken along line I-I' of FIG. 5. FIG. 7A is an enlarged cross-sectional view illustrating region AA in FIG. 6. FIG. 7B is a graph showing relative intensities versus wavelength ranges of color lights. FIG. 8 is an enlarged schematic view illustrating optical characteristics of an embodiment of a light control layer in FIG. 6. Here, the lower display substrate 100 is simply illustrated in FIGS. 6 and 7A, without defining elements or components thereof in detail.

Referring to FIG. 5, since light emitted from the light emitting element OLED described in FIG. 4B is not visible at the non-display area NDA of the display panel DP, the upper display substrate 200 may include a light shielding layer BY overlapping the non-display area NDA. In an embodiment, for example, the light shielding layer BY may be disposed closer to the display area DA than the adhesive layer SLM disposed between the upper display substrate 200 and the lower display substrate 100.

The adhesive layer SLM may overlap the non-display area NDA and surround the display area DA on a plane. The adhesive layer SLM may be disposed between the upper display substrate 200 and the lower display substrate 100 while being disposed adjacent to an edge of the display panel DP. The light shielding layer BY according to an embodiment of the invention may have a black color.

In an embodiment of a method of providing a display panel DP, a material for forming the adhesive layer SLM may be disposed between the upper display substrate 200 and the lower display substrate 100, and then ultraviolet light rays may be irradiated to material for curing the material and forming the adhesive layer SLM. In this case, the ultraviolet light rays irradiated to the material for forming the adhesive layer SLM may be incident through the upper display substrate 200.

According to an embodiment of the invention, the light shielding layer BY may partially overlap the non-display area NDA instead of overlapping an entirety of the non-display area NDA. In an embodiment, for example, the light shielding layer BY may not overlap at least a portion of the adhesive layer SLM. Accordingly, the ultraviolet light rays incident through the upper display substrate 200 in a method of providing a display panel DP may be irradiated to the adhesive layer SLM at an area where the light shielding layer BY is excluded.

External light may be incident from outside the display panel DP through a planar area of the upper display substrate 200 which is in the non-display area NDA and disposed non-overlapping with the adhesive layer SLM. That is, the external light incident through the planar area of the upper display substrate 200 may transmit to an inside of the display panel DP, may be reflected from the inside of the display panel and transmitted to the outside again. As a result, visibility of an image which is displayed by the display panel DP is degraded by external reflection.

According to one or more embodiment of the invention, the upper display substrate 200 may include a filter layer FY covering the planar area of the upper display substrate 200 at which external light is transmitted through the upper display substrate 200 to be incident inside the display panel DP. Unlike the light shielding layer BY which absorbs external ultraviolet light rays which are be irradiated to the material for forming the adhesive layer SLM in a method of providing a display panel DP, the filter layer FY may allow transmission of ultraviolet light rays therethrough. Also, the filter layer FY may absorb light in a predetermined wavelength range within a wavelength range of external light incident to the display panel DP from the outside thereof. The external light may be considered natural light or light other than the ultraviolet light rays described above which used in a process of forming the adhesive layer SLM.

In an embodiment, for example, as illustrated in FIG. 5, the filter layer FY may overlap an entirety of the adhesive layer SLM and surround the display area DA in the top plan view. In FIG. 6, for example, a minimum distance from the display area DA to an outermost portion of the filter layer FY may be greater than a minimum distance from the display area DA to an outermost portion of the adhesive layer SLM. As used throughout all portions of this disclosure, the outermost portion of an element or component may be defined as an outer edge or boundary thereof. These distances may be taken along a horizontal direction in FIG. 6, where such horizontal direction may represent the first direction DR1 and/or the second direction DR2.

However, the embodiment of the invention is not limited thereto. In another example, a minimum distance from the display area DA to an outermost portion of the filter layer FY may be substantially the same as a minimum distance from the display area DA to an outermost portion of the adhesive layer SLM.

Specifically, referring to FIG. 6, the upper display substrate 200 includes a second base substrate BS2, the light shielding layer BY, a color filter layer CFY, a light control layer CCL, a first upper insulation layer LY, and a second upper insulation layer IY. Although not shown, in another embodiment of the invention, when display elements corresponding to the first to third pixel areas PXA-R, PXA-G, and PXA-B generate light having different colors from each other, the light control layer CCL may be omitted.

The second base substrate BS2 may include a synthetic resin substrate or a glass substrate. The light shielding layer BY and the color filter layer CFY divided by the light shielding layer BY may be disposed on the second base substrate BS2.

The light shielding layer BY includes a first portion BMa overlapping the display area DA and a second portion BMb overlapping the non-display area NDA. The first portion BMa of the light shielding layer BY corresponds to the light shielding area NPXA described for FIG. 4A, and the light shielding layer BY in FIG. 5 corresponds to the second portion BMb.

A first color filter CF1, a second color filter CF2 and a third color filter CF3 may be disposed on the second base substrate BS2. As used throughout all portions of this disclosure, the first color filter CF1, the second color filter CF2 and the third color filter CF3 may otherwise be referred to as first to third color filters CF1, CF2, and CF3. According to an embodiment of the invention, the first to third color filters CF1, CF2, and CF3 may be disposed on the second base substrate BS2. In an embodiment, the first to third color filters CF1, CF2, and CF3 directly disposed on a bottom surface of the second base substrate BS2 decrease a reflectance of external light incident to the display panel DP from outside thereof. The reflectance of external light may decrease because each of the first to third color filters CF1, CF2, and CF3 transmits light in a specific wavelength range and absorbs light in a remaining wavelength range with respect to a total wavelength range of the external light.

The first color filter CF1 may transmit light corresponding to a wavelength range of a second color and absorb light in a remaining wavelength range while overlapping the first pixel area PXA-R in FIG. 4A. In an embodiment, for example, the second color may be a red color.

The second color filter CF2 may transmit light corresponding to a wavelength range of a third color and absorb light in a remaining wavelength range while overlapping the second pixel area PXA-B. In an embodiment, for example, the third color may be a green color.

The third color filter CF3 may transmit light corresponding to a wavelength range of a first color and absorb light in a remaining wavelength range while overlapping the third pixel area PXA-B. As described above, the first color light may be the blue light that is the source light.

According to an embodiment of the invention, the first to third color filters CF1, CF2, and CF3 overlapping the display area DA may be divided into planar areas or portions of the color filter layer CFY by the first portion BMa of the light shielding layer BY. The second portion BMb of the light shielding layer BY may surround the color filter layer CFY as a collection of the first to third color filters CF1, CF2, and CF3 on a plane.

The filter layer FY may be disposed on the second base substrate BS2 while covering at least a portion of the second portion BMb of the light shielding layer BY. In an embodiment, for example, the filter layer FY may be directly disposed on the second base substrate BS2 while covering at least a portion of the second portion BMb.

As illustrated in FIG. 7A, the filter layer FY may overlap an entirety of the adhesive layer SLM. In particular, the filter layer FY may transmit ultraviolet light rays UV which are incident from outside the upper display substrate 200 and used to cure a material for forming the adhesive layer SLM. On the other hand, the second portion BMb of the light shielding layer BY blocks the ultraviolet light rays UV by absorbing the ultraviolet light rays UV. In an embodiment, for example, the light shielding layer BY has a black color.

According to an embodiment of the invention, the filter layer FY may have one of a blue color and a red color. As illustrated in FIG. 7B, when the filter layer FY has a blue color, the filter layer FY may transmit light within a blue wavelength range or absorb light within a red wavelength range and a green wavelength range.

For another example, when the filter layer FY has a red color, the filter layer FY may transmit light having the red wavelength range or absorb light having the green wavelength range and the blue wavelength range.

As described above, the filter layer FY according to an embodiment of the invention may reduce reflection of external light while simultaneously transmitting the ultraviolet light rays for curing the adhesive layer SLM. As a result, as overall external light reflection of the display panel DP is reduced, visibility may be enhanced.

Referring to FIG. 6 again, the first upper insulation layer LY may be disposed on the second base substrate BS2 while covering the first portion BMa of the light shielding layer BY and the first to third color filters CF1, CF2, and CF3, which overlap the display area DA. Also, the first upper insulation layer LY may cover the second portion BMb of the light shielding layer BY and the filter layer FY, which overlap the non-display area NDA.

The light control layer CCL is disposed on the first upper insulation layer LY. The light control layer CCL may convert the first color light emitted from the display element layer DP-OLED (refer to FIG. 4B) into light having a different color or transmit the first color light. That is, the light control layer CCL may color-convert the first color light emitted from the display element layer DP-OLED (refer to FIG. 4B) into light having a different color, or may transmit the first color light without color-conversion thereof. As color-converting, a wavelength of the first color light emitted from the display element layer DP-OLED (refer to FIG. 4B) may be changed into light having a different wavelength.

The light control layer CCL includes a first conversion member CCF1, a second conversion member CCF2, and a transmission member CCF3. The first conversion member CCF1 may overlap the first pixel area PXA-R and convert the first color light to emit second color light that is different in color from the first color light. The second conversion member CCF2 may overlap the second pixel area PXA-G and convert the first color light to emit third color light that is different in color from the second color light. The transmission member CCF3 may overlap the third pixel area PXA-B and emit first color light.

The second upper insulation layer IY may be disposed on the first upper insulation layer LY while covering the light control layer CCL.

Referring to FIG. 8, a first luminescent material EP-R may absorb the first color light, which is blue light, to emit the second color light, which is red light, and a second luminescent material EP-G may absorb the first color light to emit the third color light, which is green light. The transmission member CCF3 may not include a luminescent material. The transmission member CCF3 may transmit the first color light without color-conversion thereof.

Also, each of the first conversion member CCF1, the second conversion member CCF2, and the transmission member CCF3 may include a base resin BR. The base resin BR may be a polymer resin. In an embodiment, for example, the base resin BR may include an acryl-based resin, a urethane-based resin, a silicon-based resin, and an epoxy-based resin. The base resin BR may be a transparent resin.

Also, each of the first conversion member CCF1, the second conversion member CCF2, and the transmission member CCF3 may further include a scattering particle OL provided in plurality. As used throughout all portions of this disclosure, the scattering particle OL provided in plurality may be otherwise referred to as scattering particles OL. The scattering particles OL may include $TiO_2$ or silica-based nano-particles. The scattering particles OL may scatter light emitted from the luminescent material to emitted outside of the light control layer CCL. Also, when source light is directly transmitted like the transmission member CCF3, the scattering particles OL may scatter the source light to be emitted to outside of the light control layer CCL.

The first luminescent material EP-R and the second luminescent material EP-G included in the color control layer CCL may be fluorescent materials or quantum dots. In other words, in an embodiment, the color control layer CCL may include at least one of the fluorescent materials or the quantum dots as the first luminescent material EP-R and the second luminescent material EP-G.

The fluorescent materials used as the first luminescent material EP-R and the second luminescent material EP-G may include or be an inorganic fluorescent material. In the display panel DP, the fluorescent material used as the first luminescent material EP-R and the second luminescent material EP-G may be a red fluorescent material and a green fluorescent material, respectively.

The green fluorescent material may include at least one selected from $YBO_3:Ce^{3+}, Tb^{3+}$; $BaMgAl_{10}O_{17}:Eu^{2+}$, $Mn^{2+}$; $(Sr,Ca,Ba)(Al,Ga)_2S_4:Eu^{2+}$; $ZnS:Cu, Al$, $Ca_8Mg(SiO_4)_4Cl_2:Eu^{2+}, Mn^{2+}$; $Ba_2SiO_4:Eu^{2+}$; $(Ba,Sr)_2SiO_4:Eu^{2+}$; $Ba_2(Mg,Zn)Si_2O_7:Eu^{2+}$; $(Ba,Sr)Al_2O_4:Eu^{2+}$, $Sr_2Si_3O_8.2SrCl_2:Eu^{2+}$.

The red fluorescent material may include at least one selected from $(Sr,Ca,Ba,Mg)_2P_2O_7:Eu^{2+}, Mn^{2+}$; $CaLa_2S_4:Ce^{3+}$; $SrY_2S_4:Eu^{2+}$; $(Ca,Sr)S:Eu^{2+}$; $SrS:Eu^{2+}$; $Y_2O_3:Eu^{3+}, Bi^{3+}$; $YVO_4:Eu^{3+}, Bi^{3+}$; $Y_2O_2S:Eu^{3+},Bi^{3+}$; $Y_2O_2S:Eu^{3+}$.

However, the fluorescent materials used in the color control layer CCL are not limited to the materials described above. In other words, the fluorescent materials may use other fluorescent materials in addition to the fluorescent material materials described above.

In other embodiments, the first luminescent material EP-R and the second luminescent material EP-G included in the color control layer CCL may include or be quantum dots. The quantum dot may include a group II-VI compound, a group III-V compound, a group IV-VI compound, a group IV element, a group IV compound, or any combination thereof.

The group II-VI compound may be selected from a binary compound selected from CdSe, CdTe, ZnS, ZnSe, ZnTe, ZnO, HgS, HgSe, HgTe, MgSe, MgS, and any combination thereof; a ternary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any combination thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and any combination thereof.

The group III-V compound may be selected from a binary compound selected from GaN, GaP, GaAs, GaSb, AlN, AlP, AlAs, AlSb, InN, InP, InAs, InSb, and any combination thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any combination thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combination thereof.

The group IV-VI compound may be selected from a binary compound selected from SnS, SnSe, SnTe, PbS, PbSe, PbTe, and any combination thereof; a ternary compound selected from SnSeS, SnSeTe, SnSTe, PbSeS, PbSeTe, PbSTe, SnPbS, SnPbSe, SnPbTe, and any combination thereof; and a quaternary compound selected from SnPbSSe, SnPbSeTe, SnPbSTe, and any combination thereof. The group IV element may be selected from Si, Ge, and a combination thereof. The group IV compound may include or be a binary compound selected from SiC, SiGe, and a combination thereof.

In embodiments, the binary compound, the ternary compound, or the quaternary compound may exist in the quantum dot with a substantially uniform concentration. Alternatively, a concentration of the binary compound, the ternary compound or the quaternary compound in a portion of the quantum dot may be different from that of the binary compound, the ternary compound or the quaternary compound in another portion of the quantum dot.

The quantum dot may have a core-shell structure including a core and a shell which surrounds the core. Alternatively, the control member may have a core-shell structure in which one quantum dot surrounds another quantum dot. An interface of the core and the shell may have a concentration gradient in which a concentration of a material or an element existing in the shell becomes progressively less toward a center of the core-shell structure.

The quantum dot may be a nano-sized particle. The quantum dot may have a full width of half maximum ("FWHM") of an emission wavelength spectrum that is about 45 nm or less (in particular, about 40 nm or less, and in more particular, about 30 nm or less), and color purity and/or color reproduction can be improved in the range. In addition, light emitted by the quantum dot may be emitted in all directions, and thus a relatively wide viewing angle can be improved or realized.

Furthermore, a shape of the quantum dot may be a general shape known in the art but is not limited to a specific shape. In an embodiment, for example, the quantum dot may have a spherical shape, a pyramidal shape, a multi-arm shape, a cubic nanoparticle shape, a nanotube shape, a nanowire shape, a nanofiber shape, or a nano-plate particle shape.

According to an embodiment of the invention, the quantum dot may emit light of which a color is varied according to a particle size. When each of the first luminescent material EP-R and the second luminescent material EP-G is a quantum dot, the first luminescent material EP-R and the second luminescent material EP-G may have different particle sizes from each other. In an embodiment, for example, the first luminescent material EP-R may have a particle size greater than that of the second luminescent material EP-G. Here, the first luminescent material EP-R may emit light having a relatively longer wavelength than the second luminescent material EP-G.

Figure 9A:
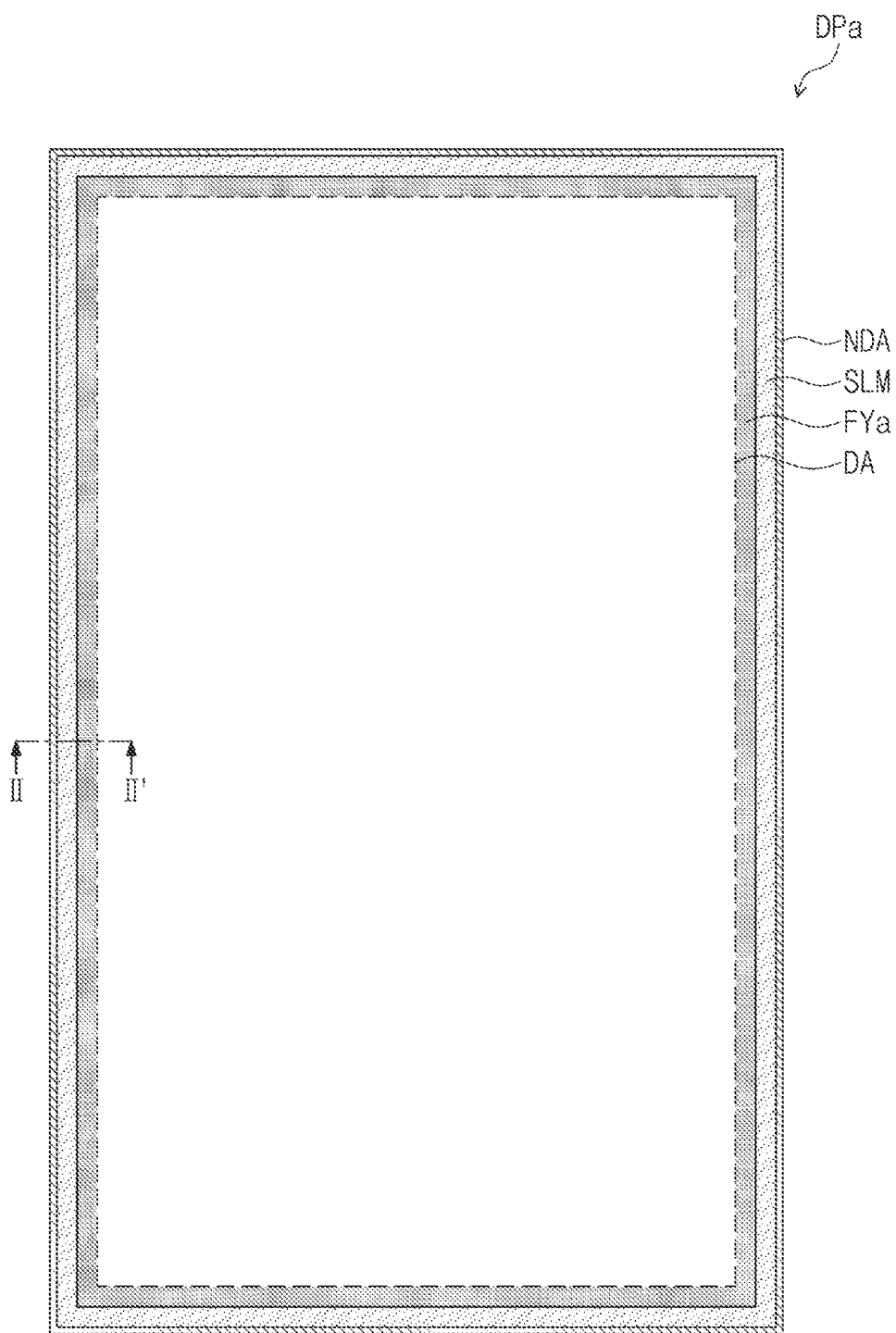
FIG. 9A is a top plan view illustrating another embodiment of a display panel.
Figure 9B:
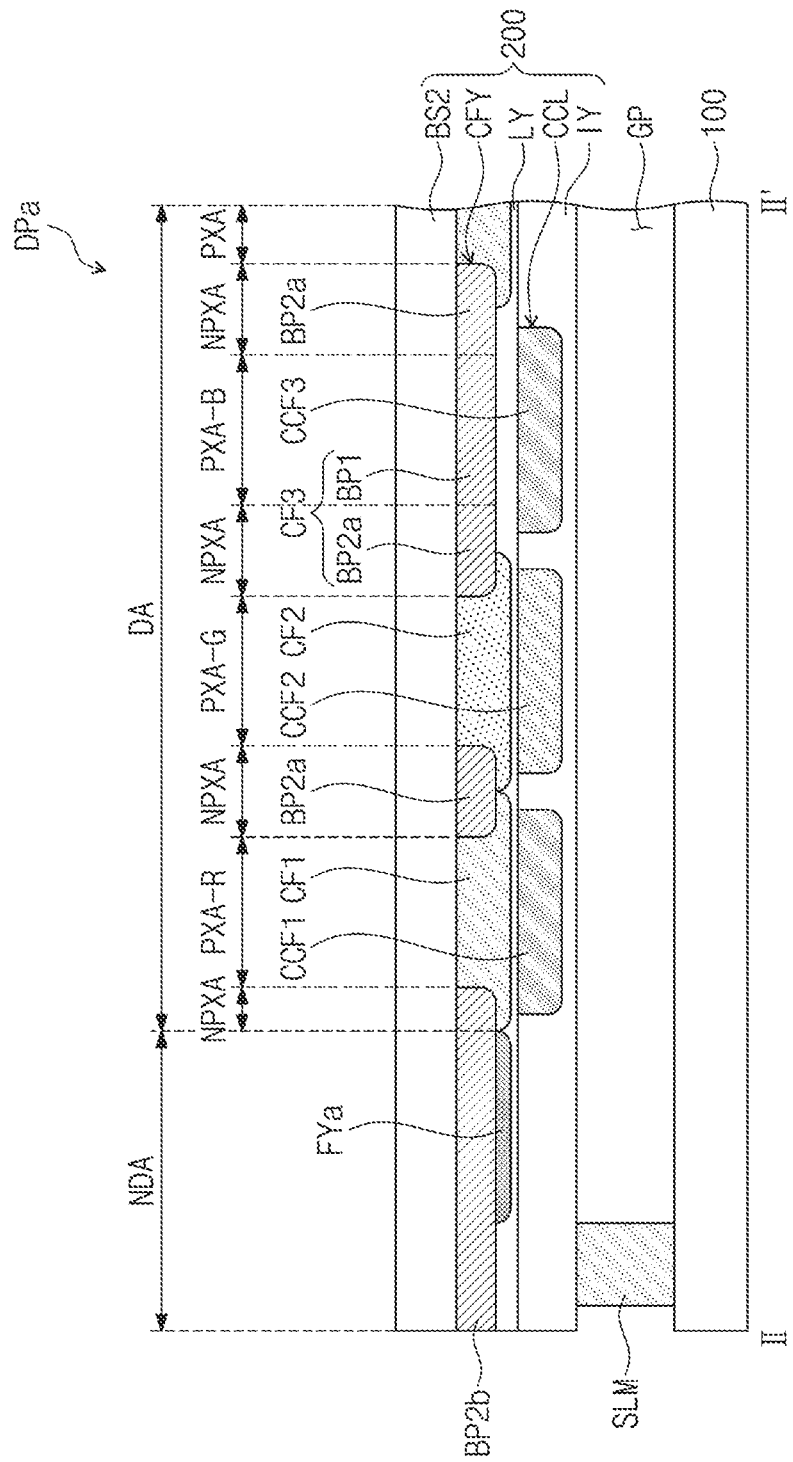
FIG. 9B is an enlarged cross-sectional view taken along line II-II' in FIG. 9A.
Figure 10:
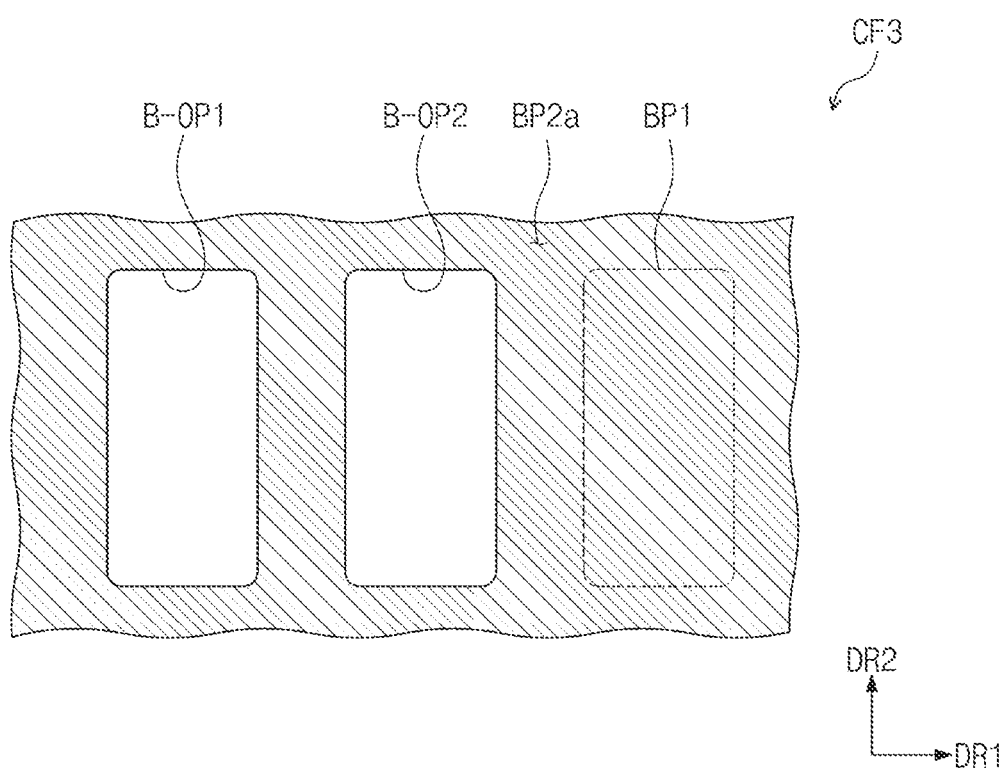
FIG. 10 is an enlarged top plan view illustrating an embodiment of a color filter in FIGS. 9A and 9B.

FIG. 9A is a top plan view illustrating another embodiment of a display panel DPA. FIG. 9B is an enlarged cross-sectional view taken along line II-II' in FIG. 9A. FIG. 10 is a top plan view illustrating an embodiment of a color filter in FIGS. 9A and 9B.

A display panel DPa in FIG. 9A has the substantially same configuration as the display panel DP in FIG. 5 except for the filter layer FY and the light shielding layer BY. Thus, redundant description will be omitted in FIGS. 9A and 9B for convenience of description.

Referring to FIG. 9A, a filter layer FYa may surround a display area DA and may not overlap an adhesive layer SLM. The adhesive layer SLM may surround the filter layer FYa, that is, be disposed closer to an edge of the display panel DPA than the filter layer FYa. That is, while the filter layer FY in FIG. 5 overlaps the adhesive layer SLM, the filter layer FYa in FIG. 9A is disposed non-overlapping with the adhesive layer SLM.

In an embodiment, the filter layer FYa may have a red color.

In detail, referring to FIG. 9B, first to third color filters CF1, CF2, and CF3 of a color filter layer CFY may be disposed on a second base substrate BS2. According to an embodiment of the invention, the first to third color filters CF1, CF2, and CF3 may be directly disposed on the second base substrate BS2.

According to an embodiment of the invention, each of the first to third color filters CF1, CF2, and CF3 may have a refractive index similar to that of the second base substrate BS2. As a result, external light incident from outside the upper display substrate 200 may be transmitted through the second base substrate BS2 and incident to the first to third color filters CF1, CF2, and CF3. Accordingly, external light reflection, which is generated at an interface between the second base substrate BS2, and the first to third color filters CF1, CF2, and CF3, may be reduced.

In particular, the third color filter CF3 may be divided into a filter portion BP1 serving as a color filter and a light shielding portion serving as a light shielding pattern. The filter portion BP1 may overlap and correspond to the third pixel area PXA-B. The light shielding portion includes a first light shielding portion BP2a overlapping the light shielding area NPXA, and a second light shielding portion BP2b overlapping the non-display area NDA. In an embodiment, for example, the second light shielding portion BP2b may overlap an entirety of the non-display area NDA and extend from the non-display area NDA to partially overlap the display area DA.

As illustrated in FIG. 10, the third color filter CF3 defines a first opening B-OP1 corresponding to the first pixel area PXA-R and a second opening B-OP2 corresponding to the second pixel area PXA-G. In an embodiment of a method of manufacturing a display panel, an organic material layer for forming the color filter layer CFY has a blue color and is formed on one surface of the second base substrate BS2, and then the organic material layer is exposed and developed to form the first opening B-OP1 and the second opening B-OP2. That is, the filter portion BP1 and the first light shielding portion BP2a may be integrated with each other as being portions of a same material layer used in forming the color filter layer CFY. Also, the second light shielding portion BP2b, the filter portion BP1 and the first light shielding portion BP2a may be integrated with each other as being portions of a same material layer used in forming the color filter layer CFY in FIG. 10.

Although not shown, the first color filter CF1 is disposed in the first opening B-OP1 defined in the third color filter CF3. The first color filter CF1 may be disposed overlapping the first light shielding portion BP2a while covering an entirety of the first opening B-OP1. The second color filter CF2 is disposed in the second opening B-OP2 defined in the third color filter CF3. The second color filter CF2 may be disposed overlapping the first light shielding portion BP2a while covering an entirety of the second opening B-OP2.

Referring to FIG. 9B again, the filter layer FYa may be disposed on the second light shielding portion BP2b while overlapping the non-display area NDA. Also, as described above, the filter layer FYa may not overlap the adhesive layer SLM at any portion thereof. However, the embodiment of the invention is not limited thereto. In an embodiment, for example, the filter layer FYa may not overlap at least a portion of the adhesive layer SLM.

As the second light shielding portion BP2b has a blue color, which is the same color as the third color filter CF3, external ultraviolet light rays may be transmitted through the second light shielding portion BP2b. Also, as the filter layer FYa non-overlaps the adhesive layer SLM, the ultraviolet light rays incident through the second base substrate BS2 from the outside may be transmitted to the adhesive layer SLM through the second light shielding portion BP2b.

Also, the filter layer FYa may be disposed over an entirety of the second light shielding portion BP2b except for a portion thereof overlapping the adhesive layer SLM. Thus, reflection of the external light incident from outside the display panel DPa may be reduced, and transmission of the first color light emitted from the display element layer DP-OLED through the non-display area NDA to the outside of the display panel DPa may be reduced or effectively prevented.

Specifically, the second light shielding portion BP2b may absorb light in a remaining wavelength range of the external light incident through the non-display area NDA of the second base substrate BS2, except for light in the blue wavelength range. Also, the light in the blue wavelength range, which is transmitted through the second light shielding portion BP2b, may be absorbed by the filter layer FYa having the red wavelength range corresponding to the second color and non-overlapping the adhesive layer SLM. Thus, as the external light incident through the second base substrate BS2 is double-blocked by the second light shielding portion BP2b and the filter layer FYa, the external light reflection may be overall reduced.

Also, light, which is transmitted to the non-display area NDA of the second base substrate BS2, among light emitted from the display element layer DP-OLED and in a direction toward the second base substrate BS2, is also absorbed by the filter layer FYa. The first color light in the blue wavelength range, which is emitted from the display element layer DP-OLED, may be absorbed by the filter layer FYa that absorbs light in the remaining wavelength range except for the red wavelength range. Thus, the overall visibility of the display panel DPa may improve.

Figure 11:
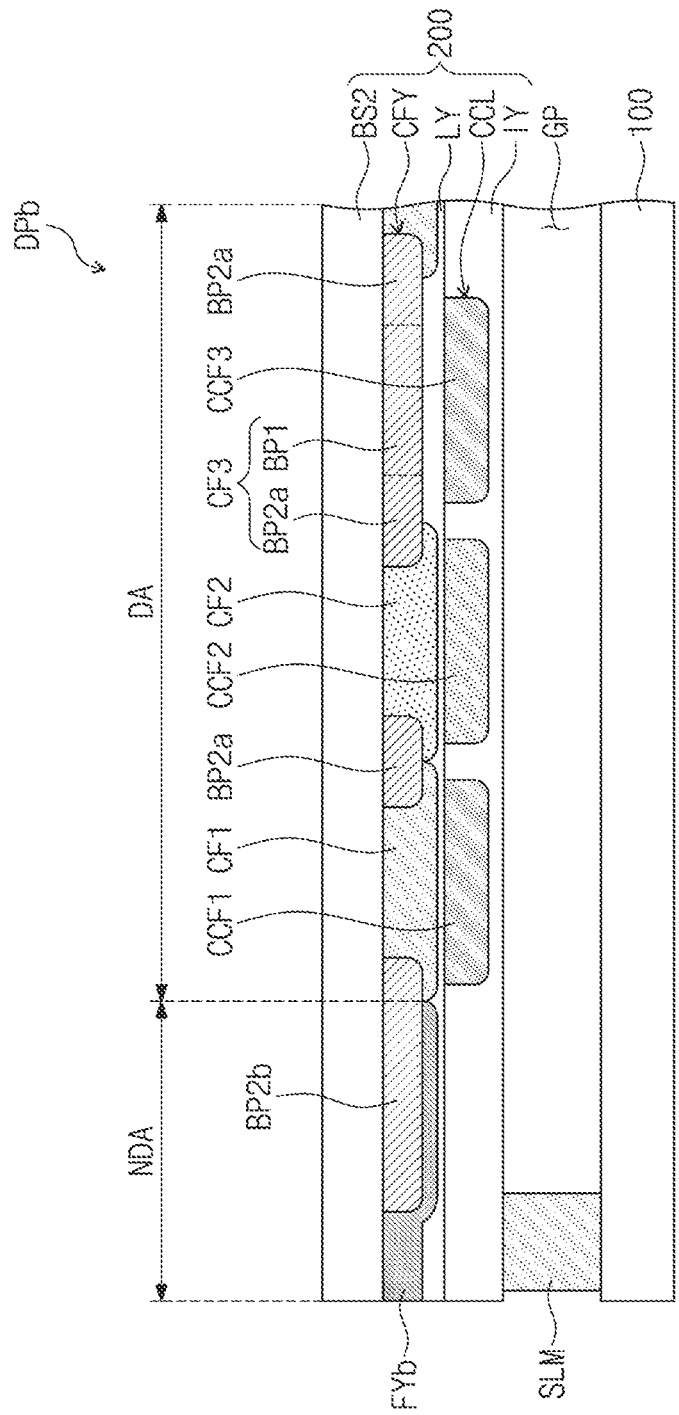
FIG. 11 is an enlarged cross-sectional view illustrating still another embodiment of a display panel.

FIG. 11 is an enlarged cross-sectional view illustrating still another embodiment of a display panel DPb.

A display panel DPb in FIG. 11 may have the substantially same configuration as the display panel DPa in FIG. 9B except for the filter layer FYa and the second light shielding portion BP2b. Thus, redundant description will be omitted in FIG. 11 for convenience of description.

Referring to FIG. 11, the second light shielding portion BP2b may be disposed on the second base substrate BS2 while non-overlapping the adhesive layer SLM. A filter layer FYb may be disposed on the second base substrate BS2 while covering an entirety of a portion of the second light shielding portion BP2b in the non-display area NDA.

Also, the filter layer FYb may overlap an entirety of the non-display area NDA, and at least a portion of the filter layer FYb may be directly disposed on the second base substrate BS2. In an embodiment, ultraviolet light rays UV incident through the second base substrate BS2 may be transmitted to the adhesive layer SLM through the filter layer FYb, and light in a partial wavelength range of external light incident through the second base substrate BS2 may be absorbed by the filter layer FYb and the second light shielding portion BP2b.

According to one or more embodiment of the invention, the filter layer of the upper display substrate 200 may transmit ultraviolet light rays UV which are irradiated to a material for forming the adhesive layer SLM disposed between the upper display substrate 200 and the lower display substrate 100, and absorb a portion of external light in a predetermined wavelength range among the wavelength ranges of the external light which is incident to the display panel from the outside thereof. Thus, as the reflection of the external light is reduced by the light blocking area of the display panel at the filter layer, the display panel having improved visibility of an image displayed thereby may be provided.

The invention has been particularly shown and described with reference to embodiments thereof. While specific terms were used, they were not used to limit the meaning or the scope of the invention described in claims, but merely used to explain the invention. Accordingly, a person having ordinary skill in the art will understand from the above that various modifications and other equivalent embodiments are also possible. Hence, the real protective scope of the invention shall be determined by the technical scope of the accompanying claims.

What is claimed is:

1. A display panel comprising:
   a first base substrate defining:
      a display area comprising a plurality of pixel areas and a light shielding area which is adjacent to each of the plurality of pixel areas, and
      a non-display area which is adjacent to the display area;
   a second base substrate facing the first base substrate;
   a sealing member between the first base substrate and the second base substrate, wherein the sealing member surrounds the display area on a plane;
   a display element layer disposed on the first base substrate;
   a color control layer disposed on the display element layer; and
   a color filter layer disposed on the color control layer and comprising:
      a first color filter corresponding to a first pixel area among the plurality of pixel areas,
      a second color filter corresponding to a second pixel area adjacent to the first pixel area among the plurality of pixel areas,
      a third color filter comprising a filter portion corresponding to a third pixel area adjacent to the second pixel area among the plurality of pixel areas,
      any one color filter among the first to third color filters further corresponding to the light shielding area, and
      the one color filter being adjacent to each of the plurality of pixel areas and defining a plurality of openings of the color filter layer which respectively overlap other color filters.

2. The display panel of claim 1, wherein
   the any one color filter is the third color filter, and
   the plurality of openings of the third color filter respectively overlaps the second color filter and the filter portion of the third color filter.

3. The display panel of claim 2, wherein
   the plurality of openings comprises a first opening corresponding to the first pixel area, and a second opening corresponding to the second pixel area, and
   the first color filter is disposed in the first opening, and the second color filter is disposed in the second opening.

4. The display panel of claim 3, wherein
   the first color filter covers an entirety of the first opening, and
   the second color filter covers an entirety of the second opening.

5. The display panel of claim 1, wherein the color filter layer further comprises:
   a first light shielding portion which corresponds to the light shielding area in the display area, and a second light shielding portion which corresponds to the non-display area,
   each of the first light shielding portion and the second light shielding portion having a first color.

6. The display panel of claim 5, wherein
   the any one color filter is the third color filter, and
   the third color filter defines each of the filter portion of the third color filter, the first light shielding portion of the color filter layer, and the second light shielding portion of the color filter layer.

7. The display panel of claim 5, wherein each of the first color filter and the second color filter is disposed at least partially overlapping the first light shielding portion.

8. The display panel of claim 5, further comprising:
   a filter layer which is in the non-display area, the filter layer disposed non-overlapping the sealing member.

9. The display panel of claim 8, wherein the filter layer is disposed on the second light shielding portion.

10. The display panel of claim 1, wherein the display element layer comprises first to third display elements each of which emits light having a first color, the first to third display elements corresponding to the first to third pixel areas, respectively.

11. The display panel of claim 10, wherein the first color is blue.

12. The display panel of claim 10, wherein
the first color filter transmits light having a second color different from the first color,
the second color filter transmits light having a third color different from the first color and the second color, and
the third color filter transmits light having the first color.

13. The display panel of claim 12, wherein
the color control layer receives the light having the first color which is emitted from the first to third display elements and provides color-converted light to the color filter layer, the color control layer comprising:
a first conversion member which corresponds to the first color filter, color-converts the light having the first color which is emitted from the display element layer into the light having the second color, and emits the light having the second color to the first color filter;
a second conversion member which corresponds to the second color filter, color-converts the light having the first color into the light having the third color, and emits the light having the third color to the second color filter; and
a transmission member which corresponds to the third color filter and transmits the light having the first color to the third color filter.

14. A display panel comprising:
a first base substrate defining:
a display area comprising a plurality of pixel areas and a light shielding area which is adjacent to each of the plurality of pixel areas, and
a non-display area which is adjacent to the display area,
a second base substrate facing the first base substrate;
a sealing member between the first base substrate and the second base substrate, wherein the sealing member is disposed in the non-display area;
a display element layer disposed on the first base substrate;
a color control layer disposed on the display element layer;
a color filter layer disposed on the color control layer and comprising a first color filter corresponding to a first pixel area among the plurality of pixel areas, and a second color filter corresponding to a second pixel area among the plurality of pixel areas; and
a light shielding layer comprising a first portion which corresponds to the display area and a second portion which corresponds to the non-display area,
wherein
a first opening corresponding to the first pixel area and a second opening corresponding to the second pixel area are defined in the light shielding layer,
the first color filter is disposed in the first opening, and
the second color filter is disposed in the second opening and has a same color as the first portion of the light shielding layer which corresponds to the display area.

15. The display panel of claim 14, wherein each of the first opening and the second opening is defined in the first portion of the light shielding layer.

16. The display panel of claim 15, wherein the sealing member surrounds the light shielding layer on a plane, the sealing member disposed non-overlapping the light shielding layer.

17. The display panel of claim 15, further comprising:
a filter layer which is disposed on the first base substrate while overlapping the sealing member, and has a color different from a color of the second portion of light shielding layer.

18. The display panel of claim 14, wherein the first portion of the light shielding layer corresponds to the light shielding area which is adjacent to each of the first to third pixel areas.

19. The display panel of claim 14, wherein
the color filter layer further comprises a third color filter corresponding to a third pixel area among the plurality of pixel areas,
a third opening corresponding to the third pixel area is defined in the light shielding layer, and
the third color filter is disposed in the third opening.

20. A display panel comprising:
a first substrate;
a plurality of pixels on the first substrate;
a first insulating layer on the pixels;
a sealing member disposed on the first insulating layer and surrounding the first substrate;
a plurality of color conversion layers, and a plurality of color transmission layers aligned with the pixels;
a second insulating layer on the color conversion layers and the color transmission layers;
a plurality of color filters aligned with the color conversion layers and the color transmission layers; and
a second substrate disposed on the color filters,
wherein among the plurality of color filters:
one of the color filters defines a plurality of openings respectively aligned with the plurality of color filters, and
the one of the color filters overlaps another color filter.

* * * * *